United States Patent [19]

Ellsworth et al.

[11] Patent Number: 5,029,283

[45] Date of Patent: Jul. 2, 1991

[54] LOW CURRENT DRIVER FOR GATE ARRAY

[75] Inventors: Daniel L. Ellsworth; Maurice M. Moll, both of Fort Collins, Colo.

[73] Assignee: NCR Corporation, Dayton, Ohio

[21] Appl. No.: 500,621

[22] Filed: Mar. 28, 1990

[51] Int. Cl.5 .................... H03K 5/02; H03K 17/284; H03K 19/094; H03K 19/092

[52] U.S. Cl. .................. 307/475; 307/296.8; 307/270; 307/443; 307/542

[58] Field of Search .............. 307/270, 296.6, 296.8, 307/475, 443, 542; 330/253, 259, 260, 274; 323/315, 316

[56] References Cited

U.S. PATENT DOCUMENTS

| | | | |
|---|---|---|---|
| 3,806,742 | 4/1974 | Powell | 307/304 |
| 4,281,261 | 7/1981 | Adam | 307/270 |
| 4,336,503 | 6/1982 | Whatley | 330/253 |
| 4,342,926 | 7/1982 | Whatley | 307/304 |
| 4,375,596 | 3/1983 | Hoshi | 307/296.8 |
| 4,461,991 | 7/1984 | Smith | 323/315 |
| 4,482,868 | 11/1984 | Whatley | 330/274 |
| 4,521,698 | 6/1985 | Taylor | 307/270 X |
| 4,596,948 | 6/1986 | Wall | 330/257 |
| 4,812,735 | 3/1989 | Sawada et al. | 307/296.8 X |
| 4,833,342 | 5/1989 | Kiryu et al. | 307/296.8 X |
| 4,843,257 | 6/1989 | Ohsawa | 307/296.8 |
| 4,843,262 | 6/1989 | Abe | 307/296.8 X |
| 4,920,287 | 4/1990 | Hartgring et al. | 307/296.8 X |
| 4,947,056 | 8/1990 | Jinbo | 307/296.8 |
| 4,952,825 | 8/1990 | Yoshida | 307/270 X |

Primary Examiner—Stanley D. Miller
Assistant Examiner—David R. Bertelson
Attorney, Agent, or Firm—Wilbert Hawk, Jr.; Stephen F. Jewett; Douglas S. Foote

[57] ABSTRACT

A low current output driver for a gate array. The driver has first and second reference voltage sources, a first transistor of a first conductivity type, and a plurality of second transistors of a second conductivity type. The first transistor is connected between the first reference voltage source and the output. The second transistors are series connected between the first and second reference voltage sources. The control electrode of the first transistor is connected to a common point between two of the second transistors. At least one of the second transistors is diode connected to provide an intermediate voltage to the control electrode of the first transistor, thereby reducing the output current flow.

29 Claims, 2 Drawing Sheets

LOW CURRENT DRIVER FOR GATE ARRAY

The present invention relates to circuit designs for gate arrays. More particularly, it relates to a low current driver in a gate array.

BACKGROUND OF THE INVENTION

Conventional design of digital systems involves the selection and assembly of standard integrated circuits (ICs). However, it is often desirable to produce the digital system on a single large scale integrated circuit. If such large scale ICs are designed from scratch, they are referred to as custom chips. Custom chips are quite expensive to create and are usually only justified when the number of chips to be produced is quite large. Another approach is to utilize gate arrays which are sometimes referred to as semicustom chips. Gate arrays consist of a relatively large number of unconnected logic gates laid out in a prearranged pattern on a semiconductor substrate. Designs are implemented by individualizing the connection of these gates in the final metalization step.

Gate arrays have an advantage over custom chips in being relatively inexpensive to build. However, gate arrays typically only have a limited number of elements or cells from which to create a design. For example, many gate arrays have only a single size (fixed channel width and length) p channel transistor and a single size n channel transistor from which to select. Being restricted in the types of transistors available can create certain design problems.

A particular design problem that can arise is with drivers requiring higher or lower output current than available by selectively turning on or off a single transistor connected to a reference voltage. In the past, higher output current has been obtained by connecting a number of transistors in parallel. Similarly, lower current has been obtained by connecting the transistors in series. Series connection of transistors to reduce current can easily require dozens or even hundreds of transistors. This is inherently undesirable due to the large number of devices consumed.

One solution for avoiding series connected transistors is to simply accept higher than desired driver output current. This contributes to substantially increased chip power dissipation with no benefit to the design. An alternative solution is to make different size transistors available on the gate array. There are two ways this has been attempted in the past. One is by intermingling different size transistors in a predetermined layout pattern on the chip. This complicates the design process and can result in increased numbers of unused transistors. Another way is by providing dedicated areas on the chip for the layout of off size transistors. Another way is to provide such transistors in peripheral or pad areas of the gate array chip. This has the disadvantage of requiring the routing of relatively long wires which can waste layout space. It is also limited by the number and size of peripherally placed transistors, thereby reducing flexibility in the design of multiple drive current values.

OBJECTS OF THE INVENTION

It is therefore an object of the present invention to provide a new and improved low current driver for a gate array.

It is another object of the present invention to provide a low current gate array driver with a reduced number of transistors.

It is a further object of the present invention to provide a low current gate array driver which requires only uniformly sized n channel transistors and uniformly sized p channel transistors.

It is yet another object of the present invention to provide a low current gate array driver design that may be easily modified to provide a plurality of different output currents.

It is yet a further object of the present invention to provide a high density, compact layout for a low current driver in a gate array.

It is still another object of the present invention to provide a low current driver for a gate array with simplified routing of metalization lines.

It is still a further object of the present invention to provide a flexible low current driver design for implementation within a gate array.

SUMMARY OF THE INVENTION

The present invention is a gate array circuit for providing a low current to an output. The circuit comprises first and second reference voltage sources, a first transistor of a first conductivity type, a plurality of second transistors of a second conductivity type, and a third transistor. The first and third transistors are series connected between the first reference voltage source and the output. The second transistors are series connected between the first and second reference voltage sources. The control electrode of the first transistor is connected to a common point between two of the second transistors.

In one embodiment, each of the second transistors is diode connected. The conductivity of the first transistor, and hence output current, may be controlled by selecting which common point to connect to the control electrode of the first transistor. In an alternative embodiment, two second transistors are employed with one being diode connected and the other being shut off.

DESCRIPTION OF A PREFERRED EMBODIMENT

Figure 1:
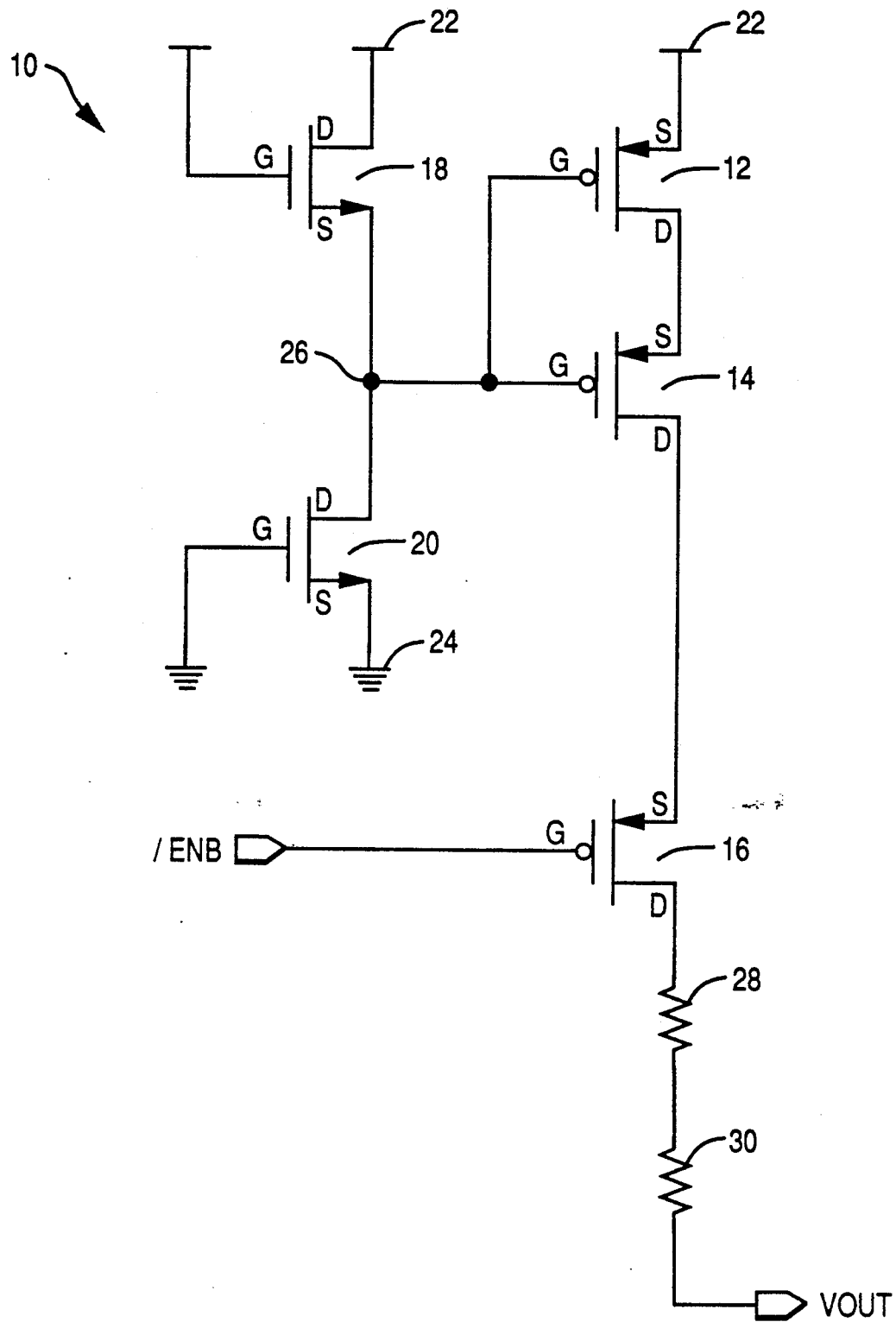
FIG. 1 is a circuit diagram of a low current driver for a gate array according to one form of the present invention.

FIG. 1 shows a driver circuit 10 constructed from transistors available in a gate array. The gate array transistors are of a defined and complementary conductivity type. More particularly, circuit 10 is constructed from p-type MOSFETs 12, 14 and 16 and n-type MOSFETs 18 and 20. Each of p-type transistors 12, 14 and 16 are uniformly sized, meaning they have nominally the same channel width and length. Similarly, each of n-type transistors 18 and 20 are uniformly sized, having nominally the same channel width and length. The drain (D), gate (G) and source (S) electrodes are shown for each of the circuit 10 transistors.

Transistors 18 and 20 are series connected between reference voltage sources 22 and 24. In a preferred embodiment, reference voltage source 22 is approximately 5 volts and reference voltage source 24 is ground. Transistor 18 is diode connected between reference voltage source 22 and the common point 26 connecting transistors 18 and 20. The gate and drain of transistor 22 are connected through their common connection to reference voltage source 22. Transistor 20 is shut off by virtue of its gate being connected to its source through their common connection to reference voltage source 24. The source of transistor 22 is connected to the drain of transistor 20 at common point 26.

Transistors 12 and 14 are series connected with transistor 16 between reference voltage source 22 and an output VOUT. In one embodiment, this output is an internal node, such as a tri-stated bus line, in a gate array chip. The source of transistor 12 is connected to reference voltage source 22. The drain of transistor 12 is connected to the source of transistor 14. The drain of transistor 14 is connected to the source of transistor 16. The drain of transistor 16 is connected to VOUT through resistors 28 and 30. Resistors R28 and R30 are provided to reduce latch up susceptibility of circuit 10, and may be eliminated if latch up protection is not required. The control electrode or gate of each transistor 12 and 14 is connected to the common point 26 between transistors 18 and 20. The control electrode or gate of transistor 16 is connected to receive an enable signal /ENB for controlling the low current flow to VOUT by selectively turning transistor 16 on and off. For a design that requires a driver that continuously sources or sinks current, transistor 16 may be eliminated.

In operation, transistors 18 and 20 establish an intermediate level voltage, between the voltage of reference voltage sources 22 and 24, at common point 26. In the absence of transistor 20, the leakage current through transistor 18 would quickly drive common point 26 to the voltage of source 22 thereby shutting off transistors 12 and 14. The presence of transistor 20 provides a leakage path to ground 24. The voltage drop across transistor 20 is designed to be greater than the voltage drop across transistor 18 to provide the desired intermediate level voltage at common point 26. As long as the threshold voltage of transistor 18 is less than half the difference between the source 22 and 24 voltages, the voltage drop across transistor 20 will be greater than the voltage drop across transistor 18. This will assure that transistor 20 has a higher leakage current than transistor 18. Thus, the voltage at common point 26 will stabilize at the intermediate voltage effective for driving transistors 12 and 14 into their ohmic operating regions.

When an active low /ENB signal is asserted, transistor 16 is turned on and a current, lowered by the ohmic characteristics of transistors 12 and 14, is provided to VOUT. The output current may be selectively varied by increasing or decreasing the number of transistors series connected with transistors 12 and 14 and having their control electrode connected to common point 26. For example, transistor 12 may be eliminated if it is desired to increase the output current above that of the FIG. 1 embodiment. Similarly, more than the two transistors 12 and 14 may be provided if a yet lower output current is required. However, due to the significant current reduction obtainable with the present invention, relatively few additional series connected transistors are required to achieve most low current drive levels. It should be noted that the p-type output current control transistor 16 may be replaced with an n-type transistor. Furthermore, transistor 16 may be eliminated if no internal on/off control of output current is required.

Figure 2:
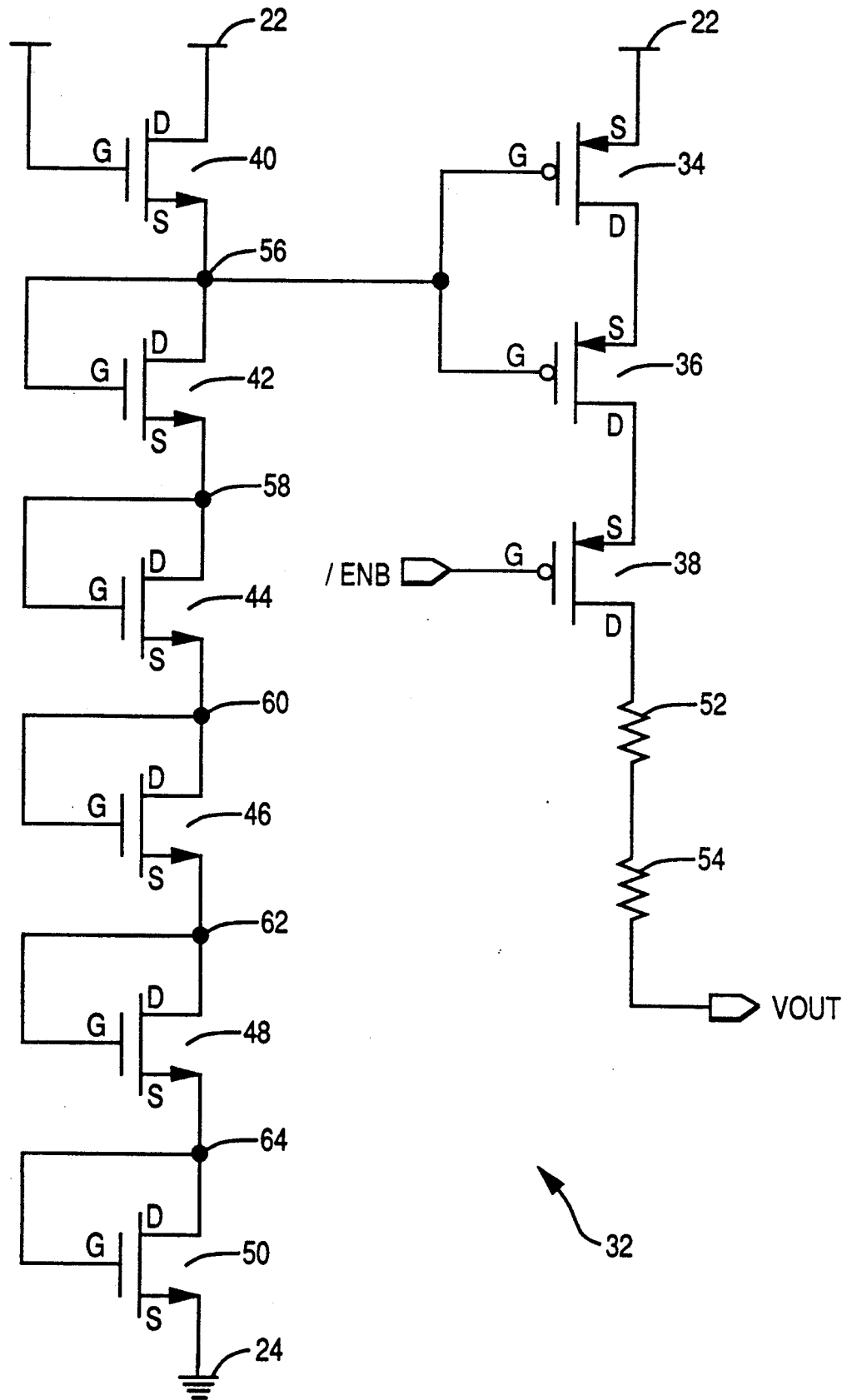
FIG. 2 is a circuit diagram of a low current driver for a gate array according to an alternative form of the present invention.

FIG. 2 shows a driver circuit 32 according to an alternative form of the present invention. As with the FIG. 1 embodiment, circuit 32 is constructed from a number of gate array transistors. These include uniformly sized p-type MOSFETs 34, 36 and 38, and uniformly sized n-type MOSFETs 40, 42, 44, 46, 48 and 50. The drain (D), gate (G) and source (S) electrodes are shown for each of the circuit 32 transistors.

Transistors 40, 42, 44, 46, 48 and 50 are series connected between reference voltage sources 22 and 24. In a preferred embodiment, reference voltage source 22 is approximately 5 volts and reference voltage source 24 is ground. Each of transistors 40, 42, 44, 46, 48 and 50 is individually diode connected with the gate of each such transistor connected to its respective drain.

Transistors 34 and 36 are series connected with transistor 38 between reference voltage source 22 and an output VOUT. The source of transistor 34 is connected to reference voltage source 22. The drain of transistor 34 is connected to the source of transistor 36. The drain of transistor 36 is connected to the source of transistor 38. The drain of transistor 38 is connected to VOUT through resistors 52 and 54. The control electrode or gate of transistors 34 and 36 are connected to the common point 56 between transistors 40 and 42. The control electrode or gate of transistor 38 is connected to receive an enable signal /ENB for selectively turning transistor 38 on and off.

In operation, a small current is established in transistors 40, 42, 44, 46, 48 and 50. While this current is significantly larger than the junction and gate leakage currents, it will be sufficiently small so as to not significantly increase static power dissipation. In this manner, transistors 40, 42, 44, 46, 48 and 50 form a voltage divider which establishes a series of intermediate level voltages, between that of reference voltage sources 22 and 24, at the common points 56, 58, 60, 62 and 64 between adjacent transistors. The desired gate voltage for transistors 34 and 36 may be provided by selectively connecting their gates to one of the common points 56, 58, 60, 62 or 64. FIG. 2 shows the gates of transistors 34 and 36 connected to common point 56. The different voltages obtainable at different common points will affect the operating region of transistors 34 and 36. For example, common point 56 will have a higher voltage than common point 58. Transistors 34 and 36, connected thereto, will be nearly turned off thereby providing a relatively low current flow. In contrast, a connection to common point 58 will provide a lower gate voltage to transistors 34 and 36 thereby slightly increasing output current. Thus, the different connections available with the FIG. 2 embodiment provide somewhat greater control over the output current than is obtainable with the FIG. 1 embodiment.

It will be clear to those skilled in the art that the present invention is not limited to the specific embodiments disclosed and illustrated herein. For example, the conductivity of the transistors illustrated herein may be reversed.

Numerous modifications, variations, and full and partial equivalents can be undertaken without departing from the invention as limited only by the spirit and scope of the appended claims.

What is desired to be secured by Letters Patent of the United States is as follows.

What is claimed is:

1. A circuit in a gate array for providing a low current to an output comprising:

first and second reference voltage sources;
a first transistor of a first conductivity type;
a plurality of second transistors of a second conductivity type series connected between said first and second reference voltage sources; and
a third transistor series connected with said first transistor between said first reference voltage source and said output;
wherein the control electrode of said first transistor is connected to a common point between two of said second transistors.

2. The circuit of claim 1 wherein each of said second transistors is diode connected.

3. The circuit of claim 2 wherein each of said second transistors is an n-type MOSFET with the gate of each such second transistor connected to its drain.

4. The circuit of claim 1 wherein said plurality of second transistors consists of two transistors, wherein one of said second transistors is diode connected and the other is shut off.

5. The circuit of claim 4 wherein said diode connected transistor has a threshold voltage less than half the difference between the reference voltage sources.

6. The circuit of claim 4 wherein said diode connected transistor is connected to said first reference voltage source and said shut off transistor is connected to said second reference voltage source.

7. The circuit of claim 6 wherein each of said second transistors is an n-type MOSFET with the gate of said diode connected transistor connected to its drain and the gate of said shut off transistor connected to its source.

8. The circuit of claim 7 wherein said common point between said second transistors is the source of said diode connected transistor and the drain of said shut off transistor.

9. The circuit of claim 1 wherein the control electrode of said third transistor is connected to receive an enable signal for selectively turning on and off said third transistor.

10. The circuit of claim 1 wherein said second transistors are the same size.

11. The circuit of claim 1 further comprising:
at least one additional transistor of said first conductivity type series connected with said first transistor;
wherein the control electrode of each of said additional transistors is connected to said common point.

12. The circuit of claim 11 wherein said first conductivity type transistors are the same size and wherein said second transistors are the same size.

13. The circuit of claim 12 wherein said first conductivity type transistors are p-type MOSFETs and said second transistors are n-type MOSFETs.

14. The circuit of claim 13 wherein said third transistor is the same size and conductivity as said first conductivity type transistors.

15. A circuit in a gate array for providing a low current to an output comprising:
first and second reference voltage sources;
a plurality of uniformly sized first transistors of a first conductivity type;
a plurality of diode connected, uniformly sized second transistors of a second conductivity type series connected between said first and second reference voltage sources; and
a third transistor of the same size and conductivity as said first transistors, series connected with said first transistors between said first reference voltage source and said output, wherein the control electrode of said third transistor is connected to receive an enable signal for selectively turning on and off said third transistor;
wherein the control electrode of each first transistor is connected to a common point between two of said second transistors.

16. The circuit of claim 15 wherein said first transistors are p-type MOSFETs and said second transistors are n-type MOSFETs with the gate of each second transistor connected to its respective drain.

17. A circuit in a gate array for providing a low current to an output comprising:
first and second reference voltage sources;
a plurality of uniformly sized first transistors of a first conductivity type;
second and third uniformly sized transistors of a second conductivity type series connected between said first and second reference voltage sources, wherein said second transistor is diode connected and said third transistor is shut off, said second transistor being connected to said first reference voltage source and said third transistor being connected to said second reference voltage source; and
a fourth transistor of the same size and conductivity as said first transistors, series connected with said first transistors between said first reference voltage source and said output, wherein the control electrode of said fourth transistor is connected to receive an enable signal for selectively turning on and off said fourth transistor;
wherein the control electrode of each first transistor is connected to the common point between said second and third transistors.

18. The circuit of claim 17 wherein said second transistor has a threshold voltage less than half the difference between the reference voltage sources.

19. The circuit of claim 18 wherein said first transistors are p-type MOSFETs and said second and third transistors are n-type MOSFETs, with the gate of said second transistor connected to its drain and the gate of third transistor connected to its source, and wherein said common point between said second and third transistors is the source of said second transistor and the drain of said third transistor.

20. In a gate array having uniformly sized transistors of a defined conductivity type, uniformly sized transistors of a complementary conductivity type, and first and second reference voltage sources, a circuit comprising:
a first of said defined conductivity type transistors connected between said first reference voltage source and an output; and
means consisting of at least two of said complementary conductivity type transistors for providing an intermediate voltage, between the voltages of said first and second voltage sources, to the control electrode of said first transistor.

21. The circuit of claim 20 wherein said complementary conductivity type transistors are individually diode connected and collectively series connected between said first and second reference voltage sources, and wherein said intermediate voltage is provided by a common point between two of said complementary type transistors.

22. The circuit of claim 21 further comprising:
   means connected to said first transistor for controlling a low current flow to said output.

23. The circuit of claim 22 wherein said controlling means includes a second of said defined conductivity type transistors, series connected with said first transistor between said first reference voltage source and said output.

24. The circuit of claim 23 further comprising at least one additional defined conductivity type transistor series connected with said first and second transistors, wherein the control electrode of each of said additional transistors receives said intermediate voltage.

25. The circuit of claim 20 wherein said complementary conductivity type transistors include second and third transistors series connected between said first and second reference voltage sources, wherein said second transistor is diode connected and said third transistor is shut off, and wherein said intermediate voltage is provided by the common point between said second and third transistors.

26. The circuit of claim 25 wherein said second transistor has a threshold voltage less than half the difference between the reference voltage sources.

27. The circuit of claim 26 further comprising:
   means connected to said first transistor for controlling a low current flow to said output.

28. The circuit of claim 27 wherein said controlling means includes a fourth transistor of said defined conductivity type, series connected with said first transistor between said first reference voltage source and said output.

29. The circuit of claim 28 further comprising at least one additional defined conductivity type transistor series connected with said first and second transistors, wherein the control electrode of each of said additional transistors receives said intermediate voltage.

* * * * *

REEXAMINATION CERTIFICATE (1974th)
United States Patent [19]
Ellsworth et al.

[11] B1 5,029,283
[45] Certificate Issued Apr. 6, 1993

[54] LOW CURRENT DRIVER FOR GATE ARRAY

[75] Inventors: Daniel L. Ellsworth; Maurice M. Moll, both of Fort Collins, Colo.

[73] Assignee: NCR Corporation, Dayton, Ohio

Reexamination Request:
No. 90/002,559, Feb. 12, 1992

Reexamination Certificate for:
Patent No.: 5,029,283
Issued: Jul. 2, 1991
Appl. No.: 500,621
Filed: Mar. 28, 1990

[51] Int. Cl.$^5$ .............. H03K 5/02; H03K 17/284; H03K 19/094; H03K 19/092
[52] U.S. Cl. .............. 307/475; 307/296.8; 307/270; 307/443; 307/542
[58] Field of Search ............ 307/296.8, 270, 575, 307/584, 270, 475, 304, 585; 323/312, 313, 315, 316, 317

[56] References Cited
U.S. PATENT DOCUMENTS

| | | | |
|---|---|---|---|
| 4,686,449 | 8/1987 | Jeffrey et al. | 323/231 |
| 4,694,199 | 9/1987 | Goetz | 307/297 |
| 4,721,866 | 1/1988 | Chi et al. | 307/270 |
| 4,833,342 | 5/1989 | Kiryu et al. | 307/296.1 |

FOREIGN PATENT DOCUMENTS

58-201119 11/1983 Japan .................. 323/312

*Primary Examiner*—Timothy P. Callahan

[57] ABSTRACT

A low current output driver for a gate array. The driver has first and second reference voltage sources, a first transistor of a first conductivity type, and a plurality of second transistors of a second conductivity type. The first transistor is connected between the first reference voltage source and the output. The second transistors are series connected between the first and second reference voltage sources. The control electrode of the first transistor is connected to a common point between two of the second transistors. At least one of the second transistors is diode connected to provide an intermediate voltage to the control electrode of the first transistor, thereby reducing the output current flow.

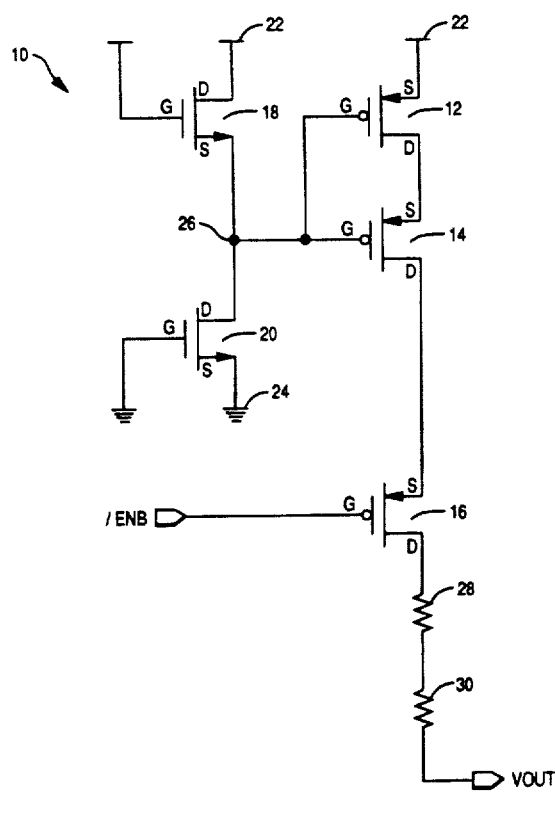

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 2, line 65 to Column 3, line 9:
Transistors 18 and 20 are series connected between reference voltage sources 22 and 24. In a preferred embodiment, reference voltage source 22 is approximately 5 volts and reference voltage source 24 is ground. Transistor 18 is diode connected between reference voltage source 22 and the common point 26 connecting transistors 18 and 20. The gate and drain of transistor [22] *18* are connected through their common connection to reference voltage source 22. Transistor 20 is shut off by virtue of its gate being connected to its source through their common connection to reference voltage source 24. The source of transistor [22] *18* is connected to the drain of transistor 20 at common point 26.

AS A RESULT OF REEXAMINATION, IT HAS BEEN DETERMINED THAT:

The patentability of claims 15-19 is confirmed.

Claims 2, 21, 22, and 23 are cancelled.

Claims 1, 3, 4, 5, 20, and 25 are determined to be patentable as amended.

Claims 6-14, 24, 26-29 dependent on an amended claim, are determined to be patentable.

1. A circuit in a gate array for providing a low current to an output comprising:
first and second reference voltage sources;
a first transistor of a first conductivity type;
a plurality of second transistors of a second conductivity type series connected between said first and second reference voltage sources *wherein each of said second transistors is diode connected*; and
a third transistor series connected with said first transistor between said first reference voltage source and said output;
wherein the control electrode of said first transistor is connected to a common point between two of said second transistors.

3. The circuit of claim [2] *1* wherein each of said second transistors is an n-type MOSFET with the gate of each such second transistor connected to its drain.

4. The circuit of claim 1 wherein said plurality of second transistors consists of two transistors, wherein one of said second transistors [is diode connected and the other] is shut off.

5. [The circuit of claim 4 wherein said diode connected transistor] *A circuit in a gate array for providing a low current to an output comprising:*
*first and second reference voltage sources;*
*a first transistor of a first conductivity type;*
*second and third transistors of a second conductivity type series connected between said first and second reference voltage sources;*
*wherein said second transistor is diode connected and has a threshold voltage less than half the difference between the reference voltage sources, and said third transistor is shut off; and*
*a fourth transistor series connected with said first transistor between said first reference voltage source and said output;*
*wherein the control electrode of said first transistor is connected to a common point between said second and third transistors.*

20. In a gate array having uniformly sized transistors of a defined conductivity type, uniformly sized transistors of a complementary conductivity type, and first and second reference voltage sources, a circuit comprising:
a first of said defined conductivity type transistors connected between said first reference voltage source and an output; [and]
means consisting of at least two of said complementary conductivity type transistors for providing an intermediate voltage, between the voltages of said first and second voltage sources, to the control electrode of said first transistor;
*wherein said complementary type transistors are individually diode connected and collectively series connected between said first and second reference voltage sources, and wherein said intermediate voltage is provided by a common point between two of said complementary type transistors;*
means connected to said first transistor for controlling a low current flow to said output including a second of said defined conductivity type transistors, series connected between said first reference voltage source and said output; and
at least one additional defined conductivity type transistor series connected with said first and second transistors, wherein the control electrode of each of said additional transistors receives said intermediate voltage.

25. [The circuit of claim 20] *In a gate array having uniformly sized transistors of a defined conductivity type, uniformly sized transistors of a complementary conductivity type, and first and second reference voltage sources, a circuit comprising:*
*a first of said defined conductivity type transistors connected between said first reference voltage source and an output; and*
*means consisting of at least two of said complementary conductivity type transistors for providing an intermediate voltage, between the voltages of said first and second voltage sources, to the control electrode of said first transistor;*
wherein said complementary conductivity type transistors include second and third transistors series connected between said first and second reference voltage sources, wherein said second transistors is diode connected and said third transistor is shut off, and wherein said intermediate voltage is provided by the common point between said second and third transistors.

* * * * *